United States Patent [19]

Towne et al.

[11] 4,206,493
[45] Jun. 3, 1980

[54] MULTIPLE FAULT INDICATOR LIGHT PACKAGE

[75] Inventors: Herbert Towne, Old Brookville; Harold Rapp, Williston Park, both of N.Y.

[73] Assignee: North American Philips Corporation, New York, N.Y.

[21] Appl. No.: 949,602

[22] Filed: Oct. 10, 1978

[51] Int. Cl.² .............................................. G08B 5/00
[52] U.S. Cl. .................................... 362/240; 362/367; 362/800; 116/202; 340/366 R; 340/381
[58] Field of Search ...................... 362/26, 27, 28, 31, 362/32, 95, 235, 236, 237, 238, 240, 244, 367, 375, 455, 456, 800, 253; 340/366 R, 366 E, 381; 116/202

[56] References Cited

U.S. PATENT DOCUMENTS

| | | | |
|---|---|---|---|
| 2,745,094 | 5/1956 | Harrington et al. | 340/381 |
| 2,925,592 | 2/1960 | Noyes | 340/381 |
| 3,348,221 | 10/1967 | Duffield | 340/381 |
| 3,555,543 | 1/1971 | Lynch | 340/366 R |
| 3,761,920 | 9/1973 | Houbolt et al. | 340/366 |
| 3,934,105 | 1/1976 | Lockard | 362/800 |
| 4,000,405 | 12/1976 | Horwinski | 362/95 |

*Primary Examiner*—L. T. Hix
*Assistant Examiner*—Alan Mathews
*Attorney, Agent, or Firm*—Algy Tamoshunas

[57] ABSTRACT

A miniature multiple indicator light package having a plurality of light emitter devices aligned in a row, positioned on a unitary plastic base, lenses of the light emitters projecting through holes in the cover. The package is assembled by placing the cover over the light emitters while they are above final position, and then rotating the cover and pressing the combination together.

5 Claims, 3 Drawing Figures

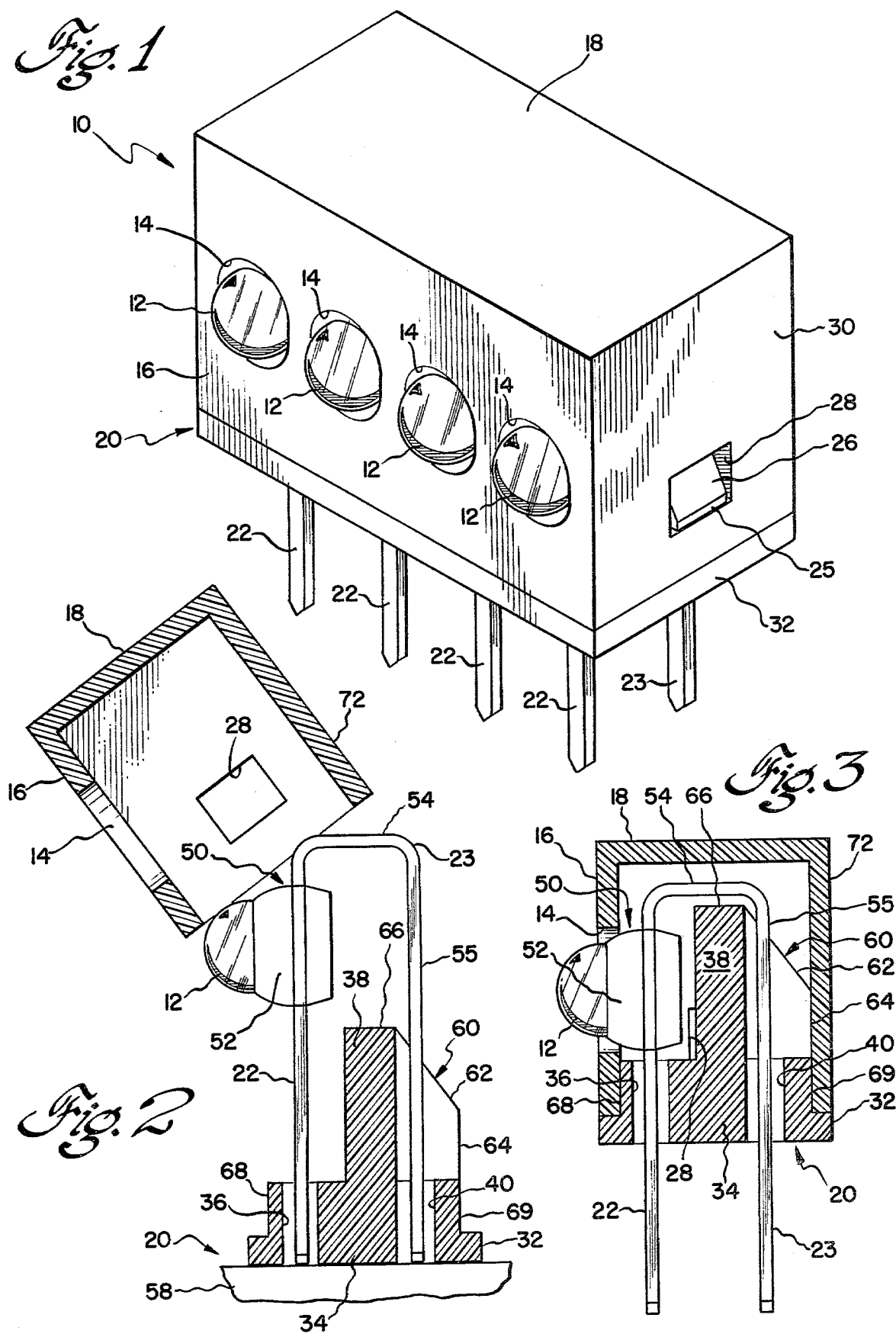

MULTIPLE FAULT INDICATOR LIGHT PACKAGE

BACKGROUND OF THE INVENTION

1. Field of the Invention

This invention relates to an article especially adapted for connection on a printed circuit board, for displaying light indications of circuit diagnostic situations, and to a method of making such an article. Fault indicators for this purpose pose a number of special problems to the designer, in particular because of the unusual orientation of the illuminating display with respect to the mounting surface of the device. These indicators are normally mounted adjacent an edge of relatively large printed circuit boards, and are arranged so that when the equipment is opened for maintenance a technician can see the light display on those boards and at those locations that are symptomatic of particular faults. The smallest physical size compatible with reasonable ease in handling and initial assembly are important, so that the fault indicator does not require a spacing between boards which is greater than what would be required for cooling air or other components.

Because of the complexity of modern day printed circuit boards, it is also often desirable to be able to indicate the portion of the major circuit within which the fault has occured. This suggests the use of a plurality of such indicators on each printed circuit board, while at the same time space and handling considerations militate against the use of a large number of separately installed devices.

2. Description of the Prior Art

Single element side-viewed logic state or fault indicators have been made in a size suitable for use on a printed circuit board, for example, the Dialight series 555 devices. These units fulfill the requirements of extremely small size, and can be stacked along side each other on 0.100 inch centers to be compatible with common printed circuit hole coordinates. These units utilize miniature light emitting diodes whose front lens portions protrude through the front of the casing of the unit, so that they can be viewed from the front and also from a certain angle to each side. The requirements of miniature size with protruding lens, however, lead to a complex construction and assembly. These known units utilize housings molded as mating halves, which are held together by gluing or ultrasonic welding.

SUMMARY OF THE INVENTION

In accordance with the invention, a multiple indicator light package is provided consisting of only two plastic moldings, plus the desired number of light emitter devices, each light emitter device having two leads extending in parallel which become both the electrical and mechanical connecting pieces for the package. The first of the two plastic moldings is a base element which extends in a longitudinal direction a distance equal to the center spacing between adjacent elements times the number of light emitters, the base having a pair of holes spaced transversely of each other and extending downward in parallel through a bottom portion of the base, first holes of each pair being aligned in the longitudinal direction. A central portion of the base extends upwardly from the bottom portion, and provides alignment and support for the light emitter device during assembly, the lens portion of each light emitter device projecting forwardly beyond the base element. The second plastic molding is a cover whose front wall has a plurality of openings equal to the number of light emitter devices, disposed so that each lens projects through one of the holes, and a rear wall, each of these walls abutting snugly against a front and rear surface of the base.

In a preferred embodiment, the cover is retained permanently against the base element by latching bosses extending in the longitudinal direction from each end of the base element, engaging corresponding holes in end walls of the cover.

Alignment of the light emitter devices during assembly is made possible by rear elements formed as part of the base element, and disposed between adjacent rear lead lengths of the light emitter devices, as well as adjoining the corresponding lengths of each of the end devices. These rear elements define channels through which the rear device leads pass. To enable placement of the cover over this assembly the rear elements are bounded by an oblique surface extending from the rear of the lower part of the rear element to the top of the base element, this oblique surface permitting slipping of the cover over the base element while tipped forward, before pressing the cover down so that the latching bosses engage the holes in the cover ends.

According to another aspect of the invention, in a method of assembling an indicator light package a plurality of light emitter devices, having lenses projecting forward of the leads of the devices, are placed over a base element with the emitter device leads extending downward to the bottom of through holes in the base element. A cover having front and rear walls spaced apart a distance equal to the front to rear dimension of a central portion of the base element is slipped over the combination of light emitter devices and base element at a forward tipped angle until openings in the front wall of the cover are aligned with the lenses of the light emitter devices; the cover is then rotated rearward to an upright position in which the front and rear walls of the cover are aligned with the front and rear surfaces of the central portion of the base, and the cover is then moved linearly downward so that it carries the light emitter devices downward simultaneously until the cover abuts a bottom portion of the base element, and the light emitter device leads extend a given distance below the base element.

The invention will be described hereinafter in greater detail with respect to a preferred embodiment shown in the drawing.

BRIEF DESCRIPTION OF THE DRAWING

FIG. 1 is a perspective view of a multiple indicator light package in accordance with the invention, FIG. 2 is a side sectional view of the indicator light package of FIG. 1, with the light emitter devices and cover in position for initial movement of the cover over the combination of light emitters and base, and FIG. 3 is a side sectional view of an assembled light package as shown in FIG. 1.

DESCRIPTION OF THE PREFERRED EMBODIMENT

In FIG. 1 a multiple indicator light package 10 has four light emitter devices whose lenses 12 project through respective slightly elongated holes 14 through the front wall 16 of a black plastic cover 18. The lower edge of the cover 18 abuts a base element 20, below which element respective first and second leads 22, 23 project perpendicular to the plane of the bottom of the base, the first leads being aligned approximately 0.10 inches apart, and the second leads being aligned in a row 0.10 inches behind the first, thereby matching typical printed circuit board spacing.

Also visible in FIG. 1 is a latching boss 25 having a tapered upper surface 26, formed on a central portion of the base element, this portion of the base element being hidden by the cover in this view. The boss projects through a latch opening 28 through the lower part of the end wall 30 of the cover 18. With this arrangement the cover is captured firmly between the latching boss and a flange 32 on the bottom portion of the base element, so that a solid permanent assembly is created.

Details of the inner parts of the light package are clearly shown in FIGS. 2 and 3, with the simplified method of assembly made possible by the novel details of the base element construction clearly illustrated. The bottom portion 34 of the base element 20 has four pairs of equally spaced holes, the first holes 36 of each pair being aligned in the longitudinal direction of the light package, spaced somewhat forward from a central portion 38, immediately behind which a series of respective second holes 40 of each pair are provided parallel to the first holes.

In FIG. 2 the light emitter devices are shown in the raised position permitting assembly of the cover 18. Each light emitter device 50 has a light emitter part 52 which preferably is formed as a light emitting diode, encapsulated in plastic and having a generally spherical front lens 12. The first lead 22 extends from the light emitter part downward to the bottom of the hole 36. The device 50 also has a second lead 23 extending from the light emitter part 52, the second lead 23 including a first length 54 bent to extend backwards from the light emitter part, and a second length 55 extending downward and into the respective second hole 40 of the pair of holes. As will be discussed below, the light emitter device may be tipped slightly forward during assembly so that the second length 55 is pressing against the top rear edge of the central portion 38, and the lower end of the first lead is resting against a surface of a jig 58, of any well known type, against which the base element is clamped by a fixture, not shown.

Extending between each of the adjacent second lengths 55 is one of a plurality of rear elements 60. In the case of the four light package of FIG. 1, there would then be three rear elements between adjacent second lengths, and an additional rear element at each end of the central portion adjoining the second lengths of the end devices. Between adjacent rear elements are channels through which the respective second lengths pass, these channels providing a guide for placing and retaining the light emitter device during the assembly process. Each rear element has a rearward oblique surface 62 extending upward from a rear surface 64 to the top 66 of the central portion 38.

To provide positioning surfaces for the cover, the bottom portion 34 of the base element 20 has a front surface 68 and a rear surface 69, the rear surface 69 being coplanar with the rear surface 64 of the rear element 60.

The cover 18 has its front wall 16 spaced a distance from a rear wall 72 equal to the distance between the front and rear surfaces 68 and 69.

By comparing FIGS. 2 and 3, the method aspect of the invention is made clear. In FIG. 2 the light emitter devices 50 are seen placed on the base element 20, so as to be positioned relative to each other and the base element in a manner that allows slipping the cover 18, while it is in a forward tipped attitude, over the tip of the lens 12 and the corner of the second lead joining the lengths 54 and 55, and sliding the cover downward while rotating it so that the lens 12 projects through the elongated opening 14 in the cover. During this stage of assembly the base element 20 will preferably be clamped to the jig 58, so that the bottom ends of the leads 22 and 23 will not project below the base portion. After the cover has been installed, at least the portions of the jig 58 immediately below the holes 36 and 40 are removed, or the entire partially assembled light package is removed from the jig, and the cover is pressed downward onto the bottom portion at the same time that it is rotated to the vertical position. As this is being done the oblique surface 62 guides the rear wall 72 of the cover toward the rear surfaces 64 and 69, while engagment of the light emitter part through the opening 14 of the cover causes the entire light emitter device 50, including its leads 22 and 23, to move downward to the final position shown in FIG. 3. As the bottom edges of the walls of the cover 18 approach the bottom flange 32 of the base element, the lower part of the cover side wall passes over the latching boss 25 shown in FIG. 1, the cover end walls springing outward slightly as this occurs, until the cover side walls snap into place between the latching boss and the flange 32, completing assembly.

By the use of the inventive method, it is possible to manufacture a simple multiple indicator light package quite inexpensively, using readily available materials. For example, the cover and the base portion may be made of any easy molding polyester plastic, preferably colored black so to provide high contrast against the color of the light emitting diodes. Again for maximum simplicity, a reverse voltage protection diode and a current limiting resistor for the light emitting diode, where needed, may be provided within the light emitter part 52, on a chip which is connected to the leads 22 and 23 before the plastic encapsulation is placed around the chip and leads.

Many mechanical variations will be understood by those of ordinary skill in the art as usable in place of details of the preferred embodiment. The flange 32 need not extend below all four walls of the cover, and in fact need not extend at all below the cover if, rather than a simple latch, a more complex fastening of the cover to the base element is chosen.

We claim:

1. An indicator light package comprising
a single unitary base element having a bottom portion elongated in a longitudinal direction, and a central portion; said bottom portion having a plurality of pairs of equally spaced holes, first holes of each pair being aligned along said direction, and second holes of each pair being aligned along said direction parallel to the line of first holes; the central portion extending longitudinally and from the bottom portion, spaced from the line of first holes and having a plurality of rear elements;
a plurality of light emitter devices, each device comprising a light emitter part and first and second leads extending therefrom, the light emitter part extending forward from the first lead; the first lead of a given device passing through a first hole of a respective pair of holes, and the second lead of the given device having a first length passing over said central portion and a second length passing through the second hole of the respective pair; said rear elements being disposed between adjacent second lengths, said rear elements thus defining channels through which the respective second lengths pass; and a cover having a front wall with a plurality of openings disposed such that a respective light emitter part projects at least into each opening, and a lower interior surface below said openings abutting a front surface of said bottom portion; and a rear wall parallel to said front wall and having an interior surface abutting a rear surface of said rear elements.

2. A light package as claimed in claim 1 wherein said rear elements have a rearward oblique surface extending from said rear surface upward and forward to a top of said central portion over which said first lengths pass.

3. A light package as claimed in claim 2 wherein said cover includes two end walls interconnecting said front and rear walls, each end wall having a latch opening through its lower part; and said base element includes a latching boss extending longitudinally from each end of the base element, arranged to engage respective latch openings in the cover end walls.

4. An indicator light package comprising a single unitary base element, a cover, and a plurality of light emitting diodes, said base element having a bottom portion defining a bottom plane and elongated in a longitudinal direction, and a central portion; said bottom portion having a plurality of pairs of equally spaced through holes, first holes of each pair being aligned along said direction perpendicular to said bottom plane, and the second holes of each pair being aligned along said direction parallel to the line of first holes; the bottom portion further including front and rear surfaces perpendicular to the bottom plane, and extending upwardly from flanges along the front and rear edges of the bottom portion of the base element; the central portion extending longitudinally and upward from the bottom portion, spaced from the line of first holes, and having a plurality of rear elements defining vertical channels aligned with respective second holes, the rear elements having a rear surface extending upward from said bottom portion rear surface and an oblique surface extending from said rear element rear surface upward and forward to a top of said central portion; and the base element also includes a latching boss extending longitudinally from each end;

said light emitting diodes being formed as part of a respective plurality of light emitter devices, each device having the light emitting diode encapsulated in a protective material with a transparent lens protruding forwardly parallel to said bottom plane, a first lead electrically connected to the light emitting diode extending downward and passing through a first hole of a respective pair of holes, and a second lead electrically connected to the light emitting diode and having a first length passing over said central portion and a second length passing downward through the second hole of the respective pair;

said cover having a front wall with a plurality of openings disposed such that the lens of a respective light emitting diode projects outwardly from each opening, and a lower interior surface of the front wall below said openings abuts said front surface of the base element, a bottom edge of the front wall abutting said front flange; a rear wall parallel to said front wall and having an interior surface abutting said rear surfaces of the base element, and a bottom edge abutting said rear flange; and end walls interconnecting said front and rear walls, each end wall having a latch opening through its lower part arranged so that the respective latching bosses engage lower edges of the latch openings to retain the cover in place.

5. A method of assemblying a multiple indicator light package which comprises a base element elongated in a longitudinal direction, having a bottom portion having parallel front and rear surfaces extending in said direction and spaced from each other a given distance and a plurality of pairs of equally spaced holes, first holes of each pair being aligned along said direction, and second holes of each pair being aligned along said direction parallel to the line of first holes, and a central portion extending above the bottom portion; a plurality of light emitter devices having first and second leads projecting downward parallel to and spaced from each other in a transverse direction, and a lens projecting in said transverse direction; and a cover having a front wall with a corresponding plurality of openings for receiving lenses of said light emitter devices, and a rear wall spaced a distance from said front wall equal to said given distance, comprising the steps of placing the base element in an upright position,
inserting the light emitter devices with their leads extending into the holes in the base element,
holding the light emitter devices in a raised position by pressure of an abutting member against a bottom end of a lead of each light emitter device, and then sequentially
slipping the cover over the projecting lens and the leads,
rotating the cover so that the light emitter deviced lenses project at least into the cover openings, and
moving the cover downward until a bottom edge of the cover engages the bottom portion of the base element, while permitting the light emitter devices to move downward simultaneously so that their leads project below the base element.

* * * * *